United States Patent [19]

van der Velden

[11] Patent Number: 4,601,928
[45] Date of Patent: Jul. 22, 1986

[54] PRINTING SLEEVE

[75] Inventor: Hendricus J. van der Velden, Cuyk, Netherlands

[73] Assignee: Stork Screens B.V., At Boxmeer, Netherlands

[21] Appl. No.: 752,957

[22] Filed: Jul. 8, 1985

Related U.S. Application Data

[62] Division of Ser. No. 559,214, Dec. 8, 1983, Pat. No. 4,554,040.

[30] Foreign Application Priority Data

Dec. 8, 1982 [NL] Netherlands .......... 8204751

[51] Int. Cl.$^4$ .......................... B32B 7/00; D04B 1/00
[52] U.S. Cl. ...................... 428/36; 156/215; 156/281; 156/286; 156/294; 156/311; 156/323; 430/307; 29/131; 29/148.4 D; 428/255; 101/368

[58] Field of Search ................. 156/212-213, 156/215, 286-287, 298, 311, 323, 285, 312, 304.1, 383.3, 294, 308.2, 309.6, 281; 101/368, 375, 378, D16; 29/132, 148.4, 131; 430/306-308; 428/36, 255-256; 138/125-126

[56] References Cited

U.S. PATENT DOCUMENTS

| | | | |
|---|---|---|---|
| 3,656,360 | 4/1972 | Fix | 156/286 |
| 3,962,394 | 6/1976 | Hall | 156/285 |
| 4,381,961 | 5/1983 | van der Velden | 156/215 |
| 4,391,898 | 7/1983 | van der Velden | 156/215 |
| 4,488,577 | 12/1984 | Shilad et al. | 138/126 |

Primary Examiner—Edward Kimlin
Assistant Examiner—Merrell C. Cashion
Attorney, Agent, or Firm—Watson, Cole, Grindle & Watson

[57] ABSTRACT

The invention concerns a printing sleeve made from a cylindrical supporting surface 4 upon which a knitted fabric 2" is applied as a gas-permeable means, providing a sheet of a thermoplastic elastomeric compositions thereupon, and applying a pressure difference and heat so as to press the sheet upon the surface and to obtain a fusion of the sheet with the fabric.

11 Claims, 1 Drawing Figure

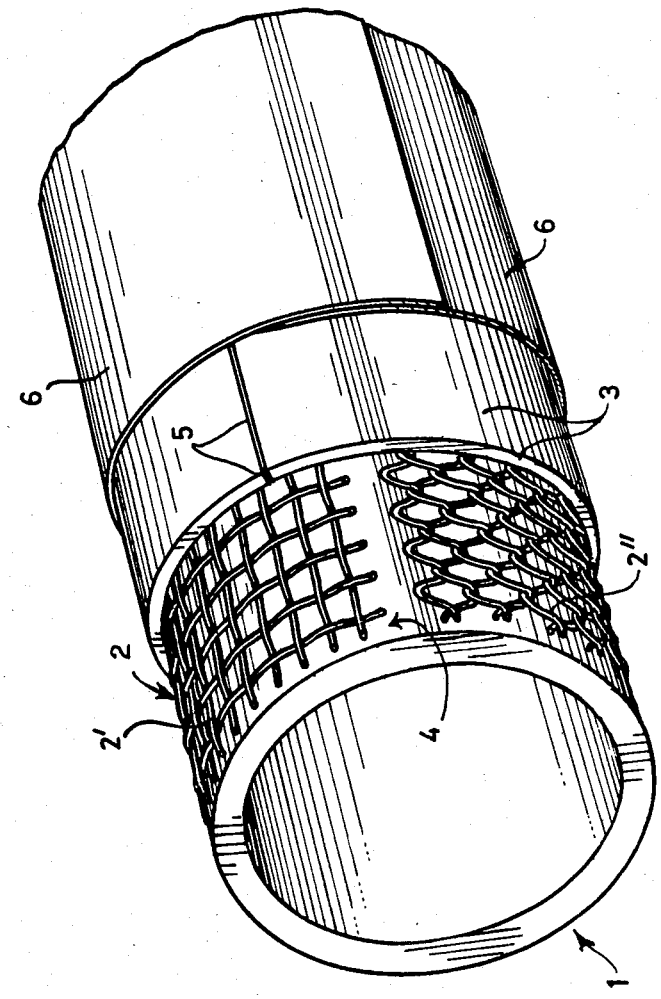

PRINTING SLEEVE

CROSS REFERENCE TO RELATED APPLICATION

This application is a divisional of application Ser. No. 559,214, now U.S. Pat. No. 554,040 filed Dec. 8, 1983.

BACKGROUND OF THE INVENTION

1. Field of the Invention

The present invention relates to a printing sleeve, i.e., a cylindrical sleeve for a printing cylinder, the printing sleeve being made by a method applying at least one sheet of a thermoplastic elastomeric composition which is hardenable under the influence of light (a photopolymer) upon a surface formed by a cylinder, gas-permeable means being provided at the cylinder surface which extend at least along the entire inside and full width of the sheet applied upon the cylinder surface, in such a manner that the sheet is pressed against the cylinder surface with the aid of a decreased gas pressure so that, by applying the pressure in conjunction with heat, the sheet is secured to the cylinder.

2. Description of the Prior Art

Printing sleeves obtained by such methods have already been used in the art. For example, U.S. Pat. No. 4,381,961 issued on May 3, 1983 to Hendricus J. van der VELDEN (assignee: STORK SCREENS B.V.) describes the use of a cylindrical core whose outer surface is provided with channels extending from one to the other end face of the cylinder and as a result of which a gas inclusion is prevented from occurring. In another method, instead of a metal cylinder an inflatable core (U.S. Pat. No. 4,391,898 issued on July 5, 1983 to the same inventor, same assignee) is used which forms a temporary support for a thin-walled metal sleeve to which the photopolymer sheet is secured.

The present invention provides an improved printing sleeve made by a method which is different from the known method first mentioned herein which in practice has the drawback, however, that the core provided with the channels cannot be utilized as a carrier for sheet-shaped printing plates which are smaller than the full circumference and/or the full length of the cylinder. So far, the printing plates have been secured to the surface by means of double-face adhesive tape but the grooved cylinder surface precluded effective adhesion of the adhesive tape. This rules out the universal usefulness of such serrated roller cores.

SUMMARY OF THE INVENTION

It is therefor a main object of the present invention to provide printing sleeve which is made by a method which does not suffer from the aforementioned drawback and which, by using simple means, enables a small clearance to be maintained between the photopolymer sheet and the cylinder surface, thus ensuring an uninhibited discharge of gas during the making of the printing sleeve.

According to the present invention, the printing sleeve is attained by a method which
the gas-permeable means consist of a knitted fabric of a plastic-fiber multifilament having a total thread thickness between 10 and 200 microns, with a mesh value between 2 and 25 meshes/inch, and
the heating being applied is carried out to come close to the plasticizing point of the photopolymer.

These measures ensure that, as a result of the heating and the reduced gas pressure, during the last phase of the method, the knitted fabric is completely enveloped by the photopolymer. A perfectly smooth outer surface of the printing sleeve is obtained as a result of a fusing of the sheet. In a favorable embodiment of the invention, the knitted fabric consists of a polyamide multifilament.

It is to be noted that the method can be used for any smooth surface, i.e., for metal cylinder surfaces but also for, for example, rubber surfaces. In the event, when working according to the serrated method, only serration-conformable materials can be used, the present method also affords utilizing as a foundation, surfaces which cannot or are hardly capable of being serrated.

A striking advantage of the present invention, improving the universal applicability of the proposed method, consists in the use of a woven fabric as the required gas-permeable means. A woven fabric in the form of a seamless sleeve or hose can adopt any shape or dimension of the cylindrical core, thus avoiding the need for a stock of gas-permeable means with different dimensions, adapted to the diameter of a whole range of cylindrical cores.

It should furthermore be noted that the reduced gas pressure is applied in a manner as described in the aforementioned U.S. Pat. No. 4,381,961, that is, via the extremities of the cylinder. The possibility that now a smooth cylinder surface can be used means a saving as compared to the method according to the aforementioned prior patent. In addition, a certain reinforcement of the printing sleeve is obtained, due to the fact that during heat treatment the knitted fabric is enclosed, either entirely or for the greater part, by the plasticizing photopolymer.

In a preferred embodiment of the invention, the method used in fabricating the inventive printing cylinder makes use of a gas-permeable means having a melting temperature between 100° and 200° C., preferably a melting temperature which is just below the plasticizing point of the photopolymer. During heat treatment, due to the melting process, the gas-permeable means are completely absorbed by the softened photopolymer material. The fusing process moreover results in greater smoothness of the outer surface of the printing sleeve, which enhances the quality of the printed material. The fusing or melting also enables thicker threads to be used in the knitted fabric (with a better gas removal) without any noticeable thickening occurring on the outside face of the sleeve.

Printers often wish to have an elastic surface affording a depth of approximately 10 millimeters. The thickness of the sheet itself, however, usually is no more than 3 millimeters. To meet this requirement, according to the invention, the cylinder surface consists of rubber or plastic.

In the embodiment of the method described hereinbefore., according to the invention the knitted fabric used may be in the form of a seamless sleeve which can be fitted about the cylinder surface in a close relation, thereby acquiring a mesh value in the order of 10 meshes/inch.

Implementing the method proceeds from a hollow metal cylinder having a smooth outer surface upon which is applied the knitted fabric made from a plastic multifilament. Said knitted fabric may be in the form of a jacket which is pulled over the cylinder surface, but these gas-permeable means may also consist of a cut-off piece of said fabric whose ends are in abutment with each other on the cylinder surface. Upon the cylinder so covered, one applies a plate or sheet of a thermoplastic elastomeric composition hardenable under the influence of light. The fabric is positioned upon the smooth cylinder surface in a specific manner, and each sheet is also applied upon the noted fabric in that same manner, such that at least one of the edges of the fabric and of each sheet adjoins an extremity of said cylinder. Along this extremity, the gas removal is carried out by suction in a manner as described by the U.S. Pat. No. 4,381,961 as previously mentioned. Effectively, prior to heating, a flexible closed layer, such as for instance a 15 $\mu$m polyvinylchloride foil, is wrapped around the outer face of the photosensitive plate or sheet.

Subsequently, heating proceeds at a temperature which is in the neighborhood of the plasticizing point of the photopolymer (the sheet). The temperature substantially corresponds to the melting temperature of the plastic multifilament and is within the range of 100° to 200° C. It is observed that no melting but only a softening of the photopolymer takes place. The total thread thickness of the multifilament is within the range of 100 to 200 microns, good results being obtained with a total thread thickness of 20-50 microns, preferably 28 microns. The 25 meshes/inch. When stretching this knitted fabric over the cylinder surface, a mesh value is obtained in the elongated condition which is of the order of 10 meshes/inch.

The ratio of the total thickness of the knitted fabric applied upon the cylinder surface to the thickness of the plate or sheet is 0:20-0:01.

The features of the present invention which are believed to be novel are set forth with particularity in the appended claims.

Other features and attendant advantages of the invention will be more readily appreciated as the same becomes better understood by reference to the following examples, and some values given with reference to the accompanying drawing, both in relation to the dimensions of the materials used and in relation to the duration of heating and the value of the pressure applied to urge the sheet against the cylinder surface as a result of the underpressure used.

BRIEF DESCRIPTION OF THE DRAWING

The FIGURE shows a perspective view of the end of a printing sleeve according to the present invention with the covering partially removed.

EXAMPLE I

Upon a metal cylinder 1 having a surface 4 a polyamide multifilament jacket 2 is applied having a mesh value of 10 meshes/inch, when in elongated position on the cylinder.

The cylinder so enclosed by the jacket is covered with a plate or sheet 3 of a thermoplastic elastomeric composition which is hardenable under the influence of light (Cyrel of Dupont). The edges 5 of the sheet 3 are brought into close-fitting abutment with each other.

Thereupon, the assembly is placed into an apparatus as described in U.S. Pat. No. 4,381,961. By creating a pressure less than atmospheric, in which case the absolute pressure is no more than 50 cm of mercury column, preferably 28 cm of mercury column (3kPa), the gases present between the sheet 3 and the surface 4 are removed by suction. Subsequently, a polyvinylchloride foil 6 having a thickness of 15 micrometers is wrapped around the assembly in order to enhance the smoothness of the outerside of the final product (the printing sleeve). Thereupon, heating takes place up to a temperature of 140° C., the heating being maintained for one hour.

After expiration of this time lapse, suction is terminated, the wrapping foil 6 is removed, and heating proceeds at 140° C. for another half hour. When fitting the wrapping foil 6 of polyvinylchloride into place, it is necessary to ensure that the overlapping parts are at a proper distance from the seam formed by the abutment edges 5 of the sheet 3. Thereupon, the assembly is cooled and a printed cylinder is obtained which is consolidated with the sheet 3 in an optimum fashion, whereupon the sheet 3 can be provided with the desired pattern.

It is to be noted that in the drawing the jacket 2 is illustrated as a woven web 20' and a knitted fabric 2" in order to show the advantage of the versatility of the latter.

EXAMPLE II

This example is similar to example I; however, the surface whereupon the closed photopolymer layer is to be applied now consists of the surface of a thin-walled, conceivably slightly conical cylinder having a smooth surface, in professional circles knows as a dud.

In order to facilitate a proper fitting of the sealings of the cylindrical closing covers, auxiliary rings are internally provided at the extremities of the cylinder, the rings being affixed to the inner surface of the cylinder, for example, by means of a temporary glue.

Effectively, while fitting the woven web or knitted-fabric jacket as in example I and applying the photopolymer sheet, the cylinder is supported on the inside by an inflated rubber bag. After fitting the foil wrapping, this bag is removed. The auxiliary rings are removed after performing the heat treatments.

Although the present invention has been shown and described in connection with some preferred embodiments thereof, it will be apparent to those skilled in the art that many variations and modifications may be made without departing from the invention in its broader aspects. It is therefore intended to have the appended claims cover all such variations and modifications as fall within the true spirit and scope of the invention.

What is claimed is:

1. A cylindrical sleeve for a printing cylinder obtained by a method comprising the steps of (1) providing a rigid support means which has cylindrical outer surface which is entirely smooth from one lateral side thereof to the other lateral side thereof, (2) placing a fabric made of fiber multifilaments around said cylindrical outer surface so as to be in direct contact therewith, said fabric extending between the lateral sides of said cylindrical outer surface, the total thread thickness of the multifilaments used therein being between 10 and 200 microns and the mesh value thereof being between 2 and 25 meshes/inch, (3) applying a sheet of a thermoplastic, elastomeric material around the outer surface of said fabric, said thermoplastic, elastomeric material being hardenable under the influence of light, and (4) simultaneously applying a vacuum to the sides of the fabric adjacent the opposite lateral sides of said cylindrical outer surface and heating the support means, the fabric and the sheet of thermoplastic, elastomeric material, resulting in said sheet of thermoplastic elastomeric material becoming bonded to said fabric and to the outer surface of the support means, thus forming the cylindrical sleeve.

2. A cylindrical sleeve as defined in claim 1, wherein said fabric is a knitted fabric made of plastic fiber multifilaments which have a melting temperature of between 100° and 200° C.

3. A cylindrical sleeve as defined in claim 2, wherein said knitted fabric is made of polyamide multifilaments.

4. A cylindrical sleeve as defined in claim 2, wherein said support means is made of a plastic material.

5. A cylindrical sleeve as defined in claim 2, wherein said support means is made of rubber.

6. A cylindrical sleeve as defined in claim 2, wherein said knitted fabric is in the form of a seamless sleeve or jacket which has a diameter slightly smaller than that of said cylindrical outer surface, such that, said knitted fabric will closely fit around said cylindrical outer surface and, when placed around said cylindrical outer surface, will acquire a mesh value of about 10 meshes/inch.

7. A cylindrical sleeve as defined in claim 2, wherein the multifilaments of the knitted fabric have a total thread thickness of 20 to 50 microns.

8. A cylindrical sleeve as defined in claim 2, wherein the ratio of the total thickness of said knitted fabric to the thickness of said sheet is 0.20 to 0.01.

9. A cylindrical sleeve as defined in claim 1, obtained by a method in which the vacuum applied in step (4) is applied by maintaining a pressure difference at the side edges of said cylindrical outer surface of 3 KPa.

10. A cylindrical sleeve as defined in claim 1, obtained by a method in which the elevated temperature in step (4) is maintained for 1 hour.

11. A cylindrical sleeve as defined in claim 1, obtained by a method step, subsequent to step (4), of discontinuing said vacuum application while maintaining said elevated temperature for one half hour.

* * * * *